(12) United States Patent
Sugimoto et al.

(10) Patent No.: US 12,387,954 B2
(45) Date of Patent: Aug. 12, 2025

(54) TEACHING METHOD FOR TRANSFER DEVICE, AND TRANSFER SYSTEM

(71) Applicant: Tokyo Electron Limited, Tokyo (JP)

(72) Inventors: Takashi Sugimoto, Yamanashi (JP); Shinya Okano, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 594 days.

(21) Appl. No.: 17/691,459

(22) Filed: Mar. 10, 2022

(65) Prior Publication Data

US 2022/0299980 A1 Sep. 22, 2022

(30) Foreign Application Priority Data

Mar. 16, 2021 (JP) ................... 2021-042857

(51) Int. Cl.
| | | |
|---|---|---|
| H01L 21/67 | (2006.01) | |
| B25J 9/16 | (2006.01) | |
| B25J 11/00 | (2006.01) | |
| G05B 19/418 | (2006.01) | |
| H01L 21/68 | (2006.01) | |
| H01L 21/687 | (2006.01) | |

(52) U.S. Cl.
CPC ...... *H01L 21/67259* (2013.01); *B25J 9/1697* (2013.01); *B25J 11/0095* (2013.01); *G05B 19/4189* (2013.01); *H01L 21/67265* (2013.01); *H01L 21/681* (2013.01); *H01L 21/68707* (2013.01); *G05B 2219/36433* (2013.01); *G05B 2219/45051* (2013.01)

(58) Field of Classification Search
CPC ...... G05B 19/4189; G05B 2219/36433; G05B 2219/45051; B25J 9/1697; B25J 11/0095; H01L 21/67259; H01L 21/67265; H01L 21/681; H01L 21/68707
See application file for complete search history.

(56) References Cited

U.S. PATENT DOCUMENTS 5,844,683 A * 12/1998 Pavloski ........... H01L 21/67167
356/399
2006/0138367 A1 6/2006 Kondoh
(Continued)

FOREIGN PATENT DOCUMENTS

| JP | 2005-262367 A | 9/2005 |
|---|---|---|
| JP | 2012049382 A | 3/2013 |

(Continued)

*Primary Examiner* — Thomas Randazzo
(74) *Attorney, Agent, or Firm* — Nath, Goldberg & Meyer; Jerald L. Meyer; Tanya E. Harkins

(57) ABSTRACT

A teaching method for a transfer device provided with a pick configured to hold a substrate and a mapping sensor, includes detecting a position of an edge of the substrate arranged in a teaching target module by the mapping sensor and setting a teaching position in one horizontal direction, transferring the substrate from the teaching target module to a stage of an alignment device by the pick based on the set teaching position, rotating the stage by a predetermined angle and detecting a locus of the position of the edge of the substrate, and estimating an eccentricity amount between the stage and the substrate based on the detected locus of the position of the edge of the substrate.

9 Claims, 9 Drawing Sheets

(56) References Cited

U.S. PATENT DOCUMENTS

| | | | |
|---|---|---|---|
| 2010/0321052 A1* | 12/2010 | Ogino | G01R 31/2887 |
| | | | 324/750.16 |
| 2014/0178162 A1 | 6/2014 | Morikawa | |
| 2019/0355604 A1* | 11/2019 | Kawabe | H01L 21/67196 |
| 2019/0371635 A1 | 12/2019 | Oori | |
| 2020/0373179 A1 | 11/2020 | Ayabe | |
| 2021/0213614 A1* | 7/2021 | Okada | H01L 21/677 |
| 2021/0252695 A1* | 8/2021 | Shindo | G05B 19/41815 |
| 2022/0299980 A1 | 9/2022 | Sugimoto et al. | |
| 2022/0351994 A1 | 11/2022 | Yoshida | |

FOREIGN PATENT DOCUMENTS

| | | |
|---|---|---|
| JP | 2014-175608 A | 9/2014 |
| JP | 2020-53417 A | 4/2020 |
| KR | 10-2020-0034607 A | 3/2020 |

\* cited by examiner

|  | 2nd | 3rd | 4th | Correction value |
|---|---|---|---|---|
| Ex 1 | -7 Detected | -1 Not detected |  | -0.5 |
| Ex 2 | -7 Detected | -1 Detected | -1 Not detected | -1.5 |
| Ex 3 | -7 Not detected | +1 Detected |  | +0.5 |
| Ex 4 | -7 Not detected | +1 Not detected | +1 Detected | +1.5 |

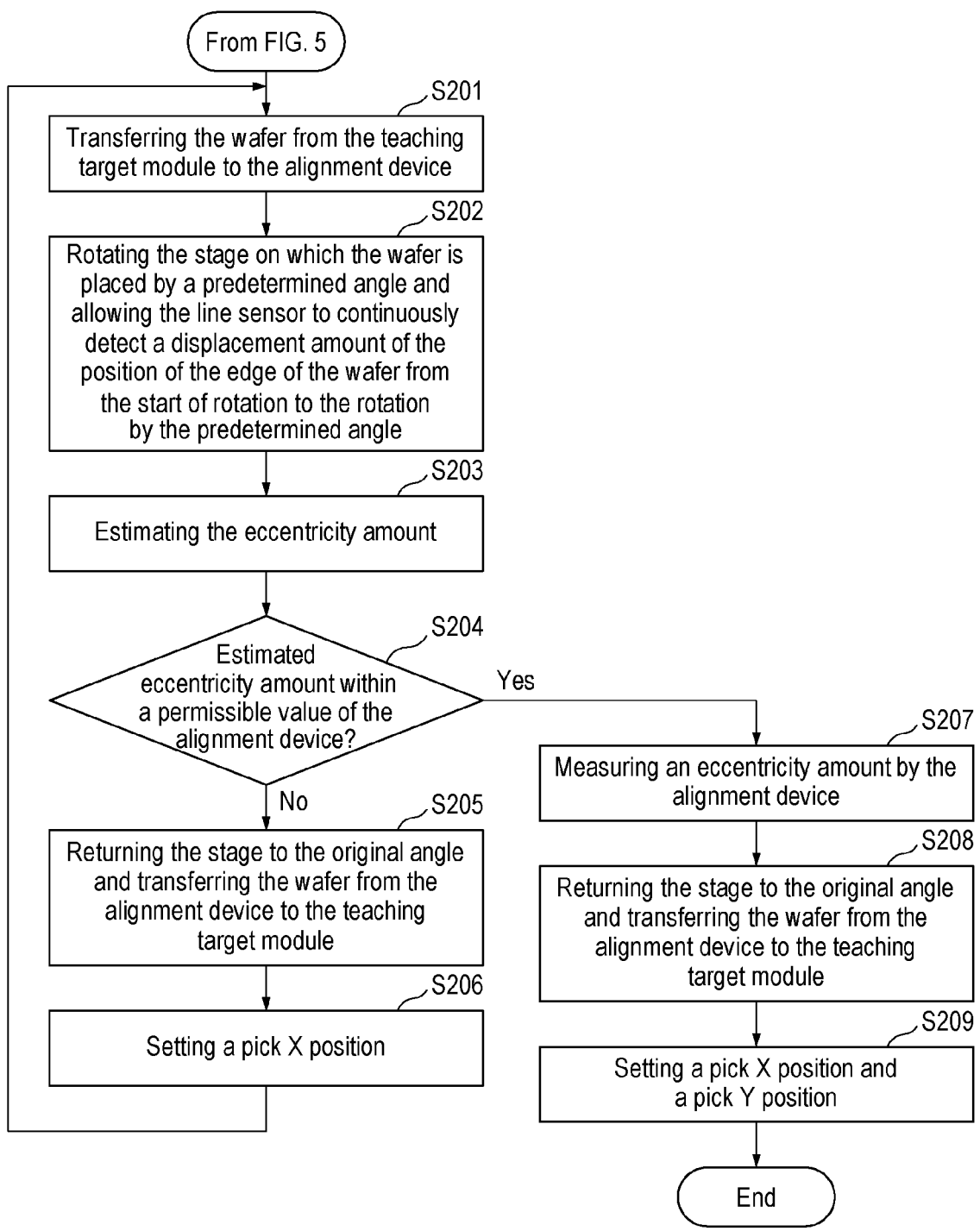

TEACHING METHOD FOR TRANSFER DEVICE, AND TRANSFER SYSTEM

CROSS-REFERENCE TO RELATED APPLICATION

This application is based upon and claims the benefit of priority from Japanese Patent Application No. 2021-042857, filed on Mar. 16, 2021, the entire contents of which are incorporated herein by reference.

TECHNICAL FIELD

The present disclosure relates to a teaching method for a transfer device, and a transfer system.

BACKGROUND

A transfer device which conveys a substrate has been known.

In Patent Document 1, there is known a method of confirming a transfer deviation of a transfer robot in a processing apparatus that includes a direction/position determination device configured to detect and correct an amount of eccentricity of a workpiece and a position of a notch mark formed on the outer periphery of the workpiece, a processing chamber configured to place the workpiece on a placement part to perform a predetermined process, a transfer robot configured to transfer the workpiece, and a controller configured to control the transfer robot, the method comprising: forming a dummy workpiece to be centered by a centering means in the processing chamber when the dummy workpiece is transferred into the processing chamber; transferring, by the transfer robot, the dummy workpiece into the processing chamber via the direction/position determination device; centering the dummy workpiece; then transferring the centered dummy workpiece to the direction/position determination device to detect an eccentricity amount and an eccentricity direction of the dummy workpiece; and confirming a transfer deviation of the transfer robot.

PRIOR ART DOCUMENT

Patent Document

Patent Document 1: Japanese Laid-Open Patent Publication No. 2005-262367

SUMMARY

According to one embodiment of the present disclosure, there is provided a teaching method for a transfer device provided with a pick configured to hold a substrate and a mapping sensor, includes detecting a position of an edge of the substrate arranged in a teaching target module by the mapping sensor and setting a teaching position in one horizontal direction, transferring the substrate from the teaching target module to a stage of an alignment device by the pick based on the set teaching position, rotating the stage by a predetermined angle and detecting a locus of the position of the edge of the substrate, and estimating an eccentricity amount between the stage and the substrate based on the detected locus of the position of the edge of the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a flowchart illustrating an example of a teaching operation of an atmospheric transfer arm.

DETAILED DESCRIPTION

Figure 1:
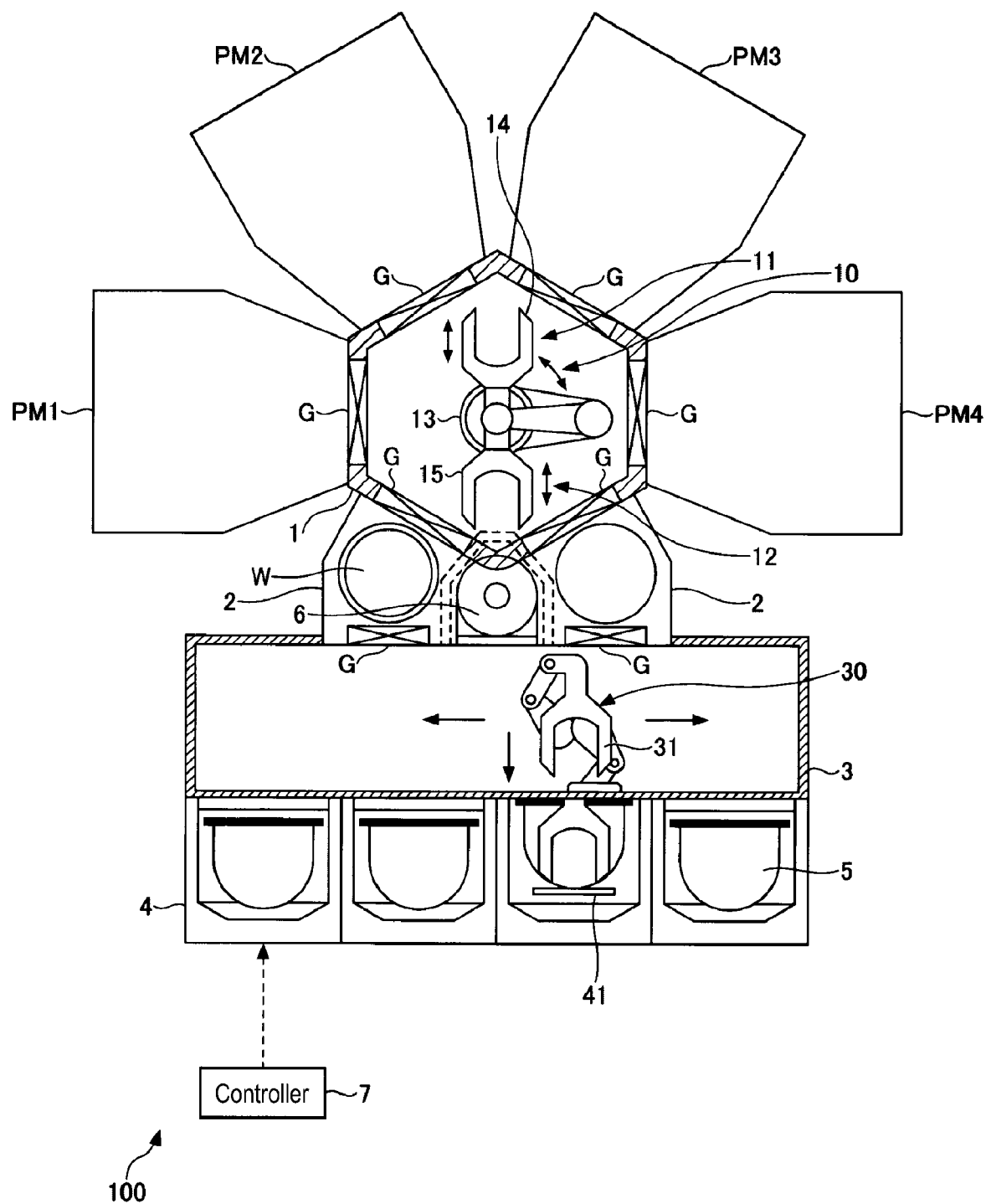
FIG. 1 is a configuration diagram showing an example of a substrate processing apparatus according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments for carrying out the present disclosure will be described with reference to the drawings. In the respective drawings, the same components are designated by like reference numerals, and duplicate explanations thereof may be omitted.

<Substrate Processing Apparatus 100>

A substrate processing apparatus 100 according to an embodiment will be described with reference to FIG. 1. FIG. 1 is a configuration diagram showing an example of a substrate processing apparatus 100 according to an embodiment.

The substrate processing apparatus 100 includes a vacuum transfer chamber 1 held in a vacuum and used for transferring a wafer W which is an example of a substrate, and a plurality of processing modules airtightly connected to the vacuum transfer chamber 1 and configured to perform predetermined processes on the wafer W. In this example, for example, four processing modules are provided. However, one or more processing modules may be provided. In the following, the four processing modules are referred to as processing chambers PM1, PM2, PM3 and PM4, and are collectively referred to as processing chamber PM. The four processing chambers PM1 to PM4 and the two load lock chambers 2 are connected to the respective sides of the hexagonal vacuum transfer chamber 1.

In the processing chambers PM1 to PM4, a predetermined process is executed on the wafer W while being heated to a predetermined temperature. For example, the processing chambers PM1 to PM4 may be COR (Chemical Oxide Removal) processing chambers or PHT (Post Heat Treatment) processing chambers. Further, for example, the process performed in the processing chambers PM1 to PM4 may be a dry etching process using plasma or an ashing process. Other processes such as a film-forming process using thermal CVD (Chemical Vapor Deposition) or ALD (Atomic Layer Deposition), an annealing process, and the like may be performed. Further, a water removal process may be performed in which the wafer W is heated to, for example, about 200 degrees C. in order to remove the water contained in the wafer W. Each of the processing chamber PM1 and the processing chamber PM4 includes a stage on which the wafer W is placed, a gas supply path for supplying a processing gas into the chamber, an exhaust pipe for evacuating the chamber, and the like.

A substrate transfer device 10 is arranged inside the vacuum transfer chamber 1. The substrate transfer device 10 includes two arms, i.e., a first transfer arm 11 and a second transfer arm 12. The substrate transfer device 10 transfers the wafer W by holding the wafer W on one or both of the two arms.

The first transfer arm 11 and the second transfer arm 12 are configured to be coaxially rotatable and vertically movable by a rotation mechanism 13 provided on the bottom surface of the vacuum transfer chamber 1. The tip portions of the first transfer arm 11 and the second transfer arm 12 are formed into, for example, a U-shape to constitute picks 14 and 15 for holding the wafer W, respectively, and are configured to be independently movable forward and backward in the horizontal direction with respect to the processing chambers PM1 to PM4 and the two load lock chambers 2.

The first transfer arm 11 and the second transfer arm 12 are connected to a rotation mechanism 13, for example, so that the movement directions thereof when extending from the rotation mechanism 13 are opposite to each other. The wafer W is delivered between each processing chamber PM and each load lock chamber 2 by the collaboration between the forward/backward movement and vertical movement of the first transfer arm 11 and the second transfer arm 12 and the vertical movement of the lift pins of the stage arranged in each processing chamber PM and configured to support the wafer W.

The load lock chambers 2 are airtightly connected to the vacuum transfer chamber 1 and are configured to switch the internal atmosphere between a vacuum atmosphere and an atmospheric atmosphere. In the present embodiment, two load lock chambers 2 are provided. However, the present disclosure is not limited thereto.

A common atmospheric transfer chamber 3 for transferring the wafer W in the atmospheric atmosphere is airtightly connected to the two load lock chambers 2. In the atmospheric transfer chamber 3, the mounting stands of load ports 4 for mounting Front Opening Unified Pods (FOUPs) 5 that stores, for example, 25 wafers W are provided at a plurality of locations. In the present embodiment, the mounting stands are provided at four locations. However, the present disclosure is not limited thereto. A pressing mechanism 41 serves to press the FOUP 5 on each mounting stand toward the atmospheric transfer chamber 3.

Inside the atmospheric transfer chamber 3, there is provided an atmospheric transfer device 30 for transferring the wafer W between the load lock chamber 2 and the FOUP 5. The atmospheric transfer device 30 includes an atmospheric transfer arm capable of moving up and down in the vertical direction and capable of rotating about a vertical axis, and a slide mechanism (not shown) configured to be movable in parallel along the load port 4. An alignment device 6 for aligning the wafer W is installed between the two load lock chambers 2. In the following description, the atmospheric transfer device 30 and the alignment device 6 are also referred to as a transfer system.

Gate valves G are provided between the vacuum transfer chamber 1 and the processing chambers PM1 to PM4, between the vacuum transfer chamber 1 and the load lock chambers 2, and between the load lock chambers 2 and the atmospheric transfer chamber 3, respectively. The wafer W is airtightly transferred by opening and closing the gate valves G.

The substrate processing apparatus 100 having such a configuration includes a controller 7 configured by, for example, a computer. The controller 7 controls the entire substrate processing apparatus 100. The controller 7 includes a memory and a CPU. The memory stores a program and a recipe used for processing in each processing chamber PM. The program includes a program related to the input operation and display of processing parameters. In the recipe, there are set a process condition such as a temperature at which each processing chamber PM is heated, a processing procedure, and a transfer path of the wafer W.

According to the program and the recipe stored in the memory, the CPU provides commands that transfer the wafer W taken out from the FOUP 5 to the processing chambers PM along predetermined paths by using the atmospheric transfer device 30, the first transfer arm 11 and the second transfer arm 12. Then, the CPU executes a predetermined process in each processing chamber PM based on the process condition set in the recipe. The program may be stored in a memory part including a non-transitory computer-readable storage medium such as a flexible disk, a compact disk, a hard disk, or an MO (magneto-optical disk) and may be installed in the controller 7. Alternatively, the program may be downloaded using a communication function.

The unprocessed wafer W carried out from the FOUP 5 is transferred to the load lock chamber 2 by the atmospheric transfer device 30. Next, the unprocessed wafer W is transferred to the processing chamber PM by the first transfer arm 11 or the second transfer arm 12. The wafer W is subjected to a desired process (e.g., a film-forming process) in the processing chamber PM. The wafer W processed in the processing chamber PM may be transferred to another processing chamber PM by the first transfer arm 11 or the second transfer arm 12 and may be further processed. The processed wafer W is returned to the FOUP 5 via the load lock chamber 2.

<Atmospheric Transfer Device 30>

Figure 2:
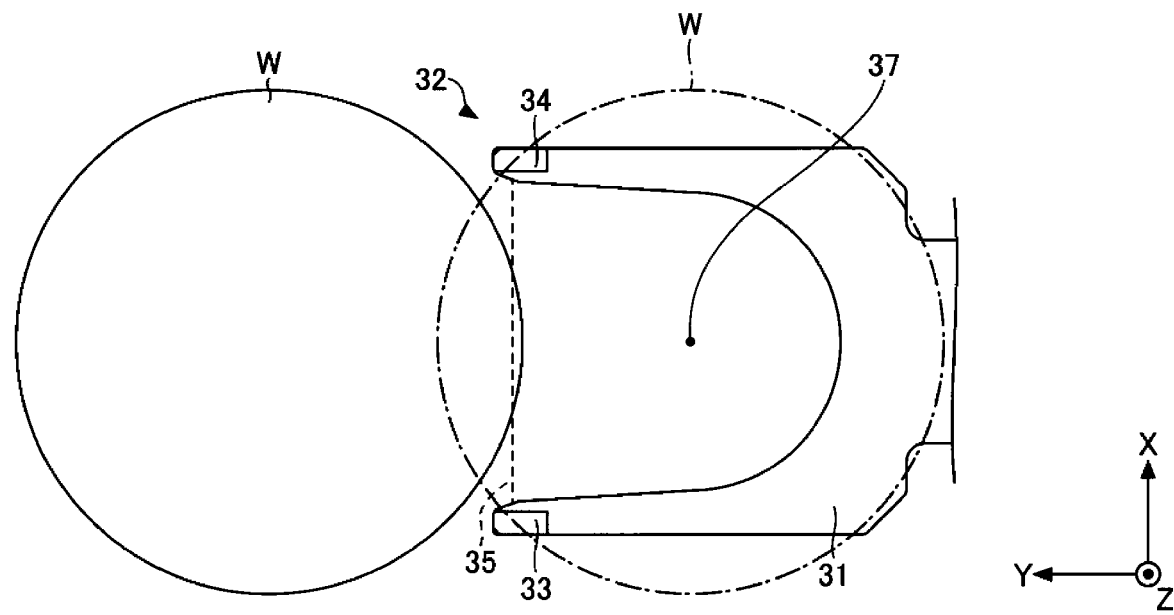
FIG. 2 is a plan view showing an example of a pick of an atmospheric transfer device and a wafer.

Next, the atmospheric transfer device 30 will be further described. FIG. 2 is a plan view showing an example of the pick 31 of the atmospheric transfer device 30 and the wafer W. The atmospheric transfer device 30 includes a pick 31 that holds and transfers the wafer W (see the one-dot chain line). Further, the pick 31 is provided with a center position 37. The center position 37 is a reference position for holding the wafer W so that the center of the wafer W coincides with the center position 37 when the wafer W is held by the pick 31. Further, the pick 31 is provided with a mapping sensor 32. The mapping sensor 32 includes a light emitting part 33 and a light receiving part 34. By sensing a beam 35 emitted from the light emitting part 33 with the light receiving part 34, the mapping sensor 32 detects the presence or absence of a light-shielding object (the wafer W) in the travel path of the beam 35.

Figure 3:
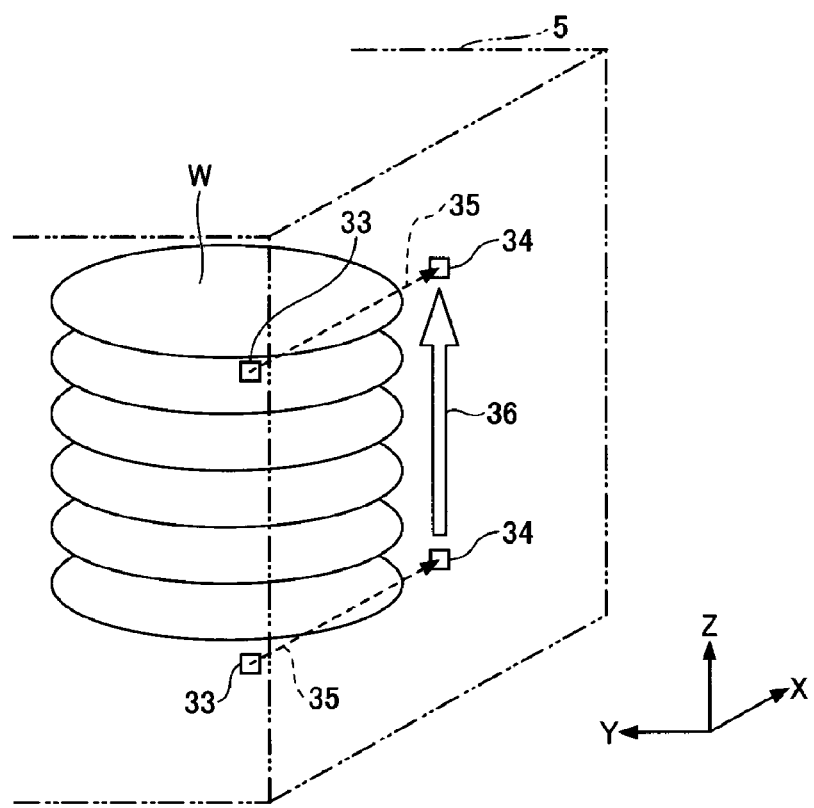
FIG. 3 is a perspective view illustrating a mapping operation.

FIG. 3 is a perspective view illustrating a mapping operation. By raising the light emitting part 33 and the light receiving part 34 (as indicated by an arrow 36), the height direction position of the wafer W accommodated in the FOUP 5 can be detected (mapped).

<Alignment Device>

Figure 4:
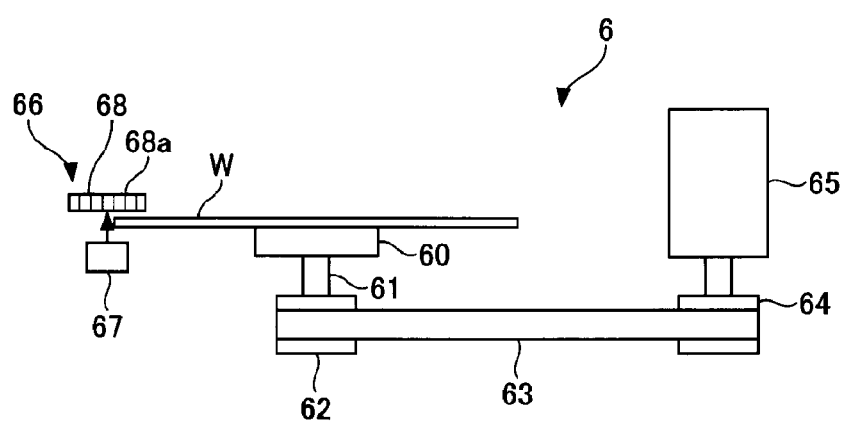
FIG. 4 is a configuration diagram showing an example of an alignment device.

FIG. 4 is a configuration diagram showing an example of the alignment device 6.

The alignment device 6 includes a stage 60 and a detection part 66.

The wafer W is placed on the surface of the stage 60. A shaft 61 and a toothed pulley 62 are provided on the back surface of the stage 60. Further, a toothed pulley 64 is provided on a rotating shaft of a motor 65. The toothed pulley 62 and the toothed pulley 64 are connected by a toothed belt 63. As a result, the stage 60 is rotated by the motor 65. In addition, the rotation angle and the rotation speed of the stage 60 can be detected by an encoder (not shown) of the motor 65.

The detection part 66 detects the edge of the wafer W. The detection part 66 includes a light source 67 and a line sensor 68. The light source 67 and the line sensor 68 are arranged so as to face each other near the end portion of the wafer W mounted on the stage 60. Further, the line sensor 68 is provided with a plurality of light receiving parts 68a in the radial direction. The detection part 66 is arranged so that the light emitted from the light source 67 reaches some light receiving parts 68a but fails to reach the remaining light receiving parts 68a by being shielded by the wafer W. As a result, the radial position of the edge of the wafer W is detected. For example, among the plurality of light receiving parts 68a arranged in the radial direction, the position of the innermost light receiving part 68a that has detected the light is detected as the radial position of the edge of the wafer W.

Further, by detecting the radial position of the edge of the wafer W while rotating the stage 60, the edge of the wafer W can be detected over the entire circumference and the center position of the wafer W can be calculated. This makes it possible to measure the amount of deviation (eccentricity) between the center position of the wafer W and the center position of the stage 60.

<Teaching Operation of Atmospheric Transfer Arm>

Next, the teaching operation of the atmospheric transfer device 30 will be described with reference to FIGS. 5 to 8D. In the present embodiment, an operation of teaching the atmospheric transfer device 30 a pick position where the wafer W accommodated in the FOUP 5 is received by the pick 31 will be described.

Figure 5:
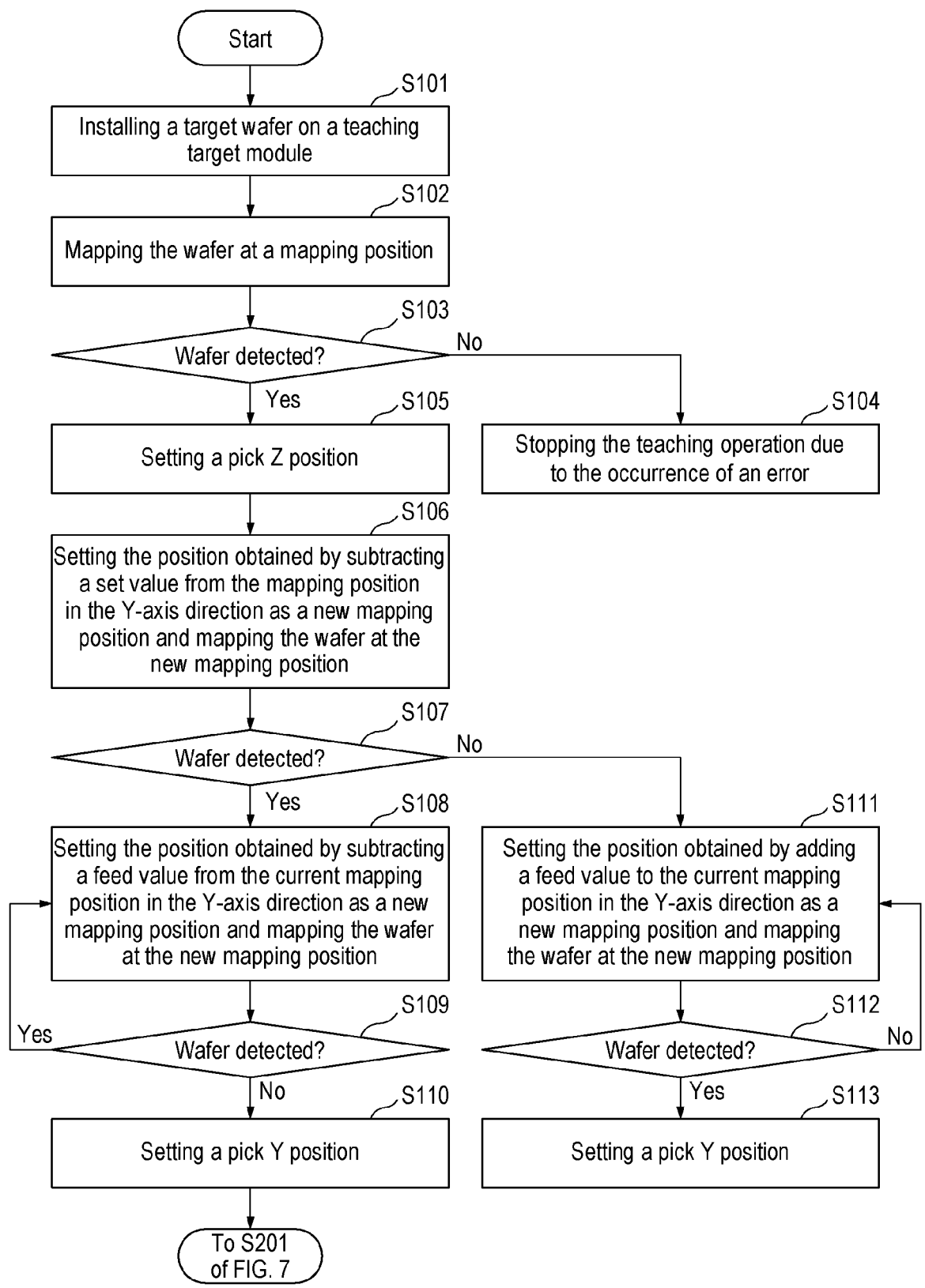
FIG. 5 is a flowchart illustrating an example of a teaching operation of an atmospheric transfer arm.

FIG. 5 is a flowchart illustrating an example of the teaching operation of the atmospheric transfer device 30. In the present embodiment, an operation of teaching a receiving position (teaching position) of the pick 31 for picking the wafer W from a predetermined slot (teaching target module) of the FOUP 5 mounted on a predetermined load port 4 will be described.

It is assumed that the teaching of the atmospheric transfer device 30 with respect to the alignment device 6 has been completed. That is, it is assumed that when the pick 31 of the atmospheric transfer device 30 is moved to the delivery position with respect to the alignment device 6, the center position 37 of the pick 31 (see FIG. 2) and the center position of the alignment device 6 (stage 60) coincide with each other. The teaching of the atmospheric transfer device 30 with respect to the alignment device 6 is realized by, for example, placing the wafer W on the pick 31 so that the center position 37 of the pick 31 and the center of the wafer W coincide with each other, transferring the wafer W and delivering the wafer W from the pick 31 to the alignment device 6 so that the center position 37 of the pick 31 becomes a temporary delivery position (design value of the delivery position) with respect to the alignment device 6, measuring an eccentricity amount and an eccentric direction of the wafer W by the alignment device 6, and correcting the temporary delivery position based on the measurement result to set a delivery position of the atmospheric transfer device 30 with respect to the alignment device 6.

In step S101, the operator installs the wafer W on the teaching target module. In the present embodiment, the operator accommodates the wafer W in a predetermined slot of the FOUP 5 and installs the FOUP 5 on a predetermined load port 4.

In step S102, the controller 7 maps the wafer W at the mapping position. In the present embodiment, the controller 7 maps the wafer W accommodated in the FOUP 5 by using the mapping sensor 32 provided on the pick 31 (see FIGS. 2 and 3). The controller 7 performs mapping by controlling the atmospheric transfer device 30 to move the pick 31 to a predetermined mapping position and raise the pick 31 in the Z-axis direction from the mapping position. The mapping position in the Y-axis direction is set to a position advanced by a predetermined set value (e.g., 7 mm) in the Y-axis direction from the edge of the wafer W. In other words, the mapping position in the Y-axis direction is determined from the design value and the set value of the position of the edge of the wafer W.

In step S103, the controller 7 determines whether the wafer W is detected by the mapping in step S102.

If the wafer W is not detected (if no in S103), the process of the controller 7 proceeds to step S104. In step S104, the controller 7 determines that an error has occurred and stops the teaching operation. Further, the controller 7 may cause a display device (not shown) to display a warning that urges the operator to check the installation state of the wafer W, the state of the atmospheric transfer device 30 (the position of the pick 31 or the like), and so forth. This makes it possible to notify the operator of the occurrence of an error.

If the wafer W is detected (if yes in S103), the process of the controller 7 proceeds to step S105. In step S105, the controller 7 sets a receiving position (pick Z position) of the pick 31 in the Z-axis direction (height direction) based on the mapping result in step S102.

In step S106, the controller 7 sets the position obtained by subtracting a predetermined set value (e.g., 7 mm) from the mapping position in the Y-axis direction as a new mapping position of the pick 31 and maps the wafer W at the new mapping position. The new mapping position in step S106 corresponds to the design value of the position of the edge of the wafer W.

In step S107, the controller 7 determines whether the wafer W is detected by the mapping in step S106.

If the wafer W is detected (if yes in S107), the process of the controller 7 proceeds to step S108.

In step S108, the controller 7 sets the position obtained by subtracting a predetermined feed value (e.g., 1 mm) from the current mapping position in the Y-axis direction as a new mapping position of the pick 31 and maps the wafer W at the new mapping position.

In step S109, the controller 7 determines whether the wafer W is detected by the mapping in step S108. If the wafer W is detected (if yes in S109), the process of the controller 7 returns to step S108, updates the mapping position with the feed value, and repeats the mapping.

If the wafer W is not detected (if no in S109), the process of the controller 7 proceeds to step S110. In step S110, the controller 7 specifies the position of the edge of the wafer W based on the mapping results in steps S106 and S108. The specifying of the edge position of the wafer W will be described later with reference to FIGS. 6A to 6C. Then, the controller 7 sets the difference between the specified position of the edge of the wafer W and the design value of the position of the edge of the wafer W as a correction value in the Y-axis direction. Further, the controller 7 corrects the design value of the receiving position in the Y-axis direction based on the correction value in the Y-axis direction, thereby setting the receiving position (pick Y position) of the pick 31 in the Y-axis direction (one horizontal direction). Then, the process of the controller 7 proceeds to step S201 of FIG. 7.

On the other hand, if the wafer W is not detected (if no in S107), the process of the controller 7 proceeds to step S111.

In step S111, the controller 7 sets the position obtained by adding a predetermined feed value (e.g., 1 mm) to the current mapping position in the Y-axis direction as a new mapping position of the pick 31 and maps the wafer W at the new mapping position.

In step S112, the controller 7 determines whether the wafer W is detected by the mapping in step S111. If the wafer W is not detected (if no in S112), the process of the controller 7 returns to step S111, updates the mapping position with the feed value, and repeats the mapping.

If the wafer W is detected (S112 Yes), the process of the controller 7 proceeds to step S113. In step S113, the controller 7 specifies the position of the edge of the wafer W based on the mapping results in steps S106 and S111. The specifying of the position of the edge of the wafer W will be described later with reference to FIGS. 6A to 6C. Then, the controller 7 sets the difference between the specified position of the edge of the wafer W and the design value of the position of the edge of the wafer W as a correction value in the Y-axis direction. Further, the controller 7 corrects the design value of the receiving position in the Y-axis direction based on the correction value in the Y-axis direction, thereby setting the picking position (pick Y position) of the pick 31 in the Y-axis direction (one horizontal direction). Then, the process of the controller 7 proceeds to step S201 of FIG. 7.

Figures 6A, 6B:
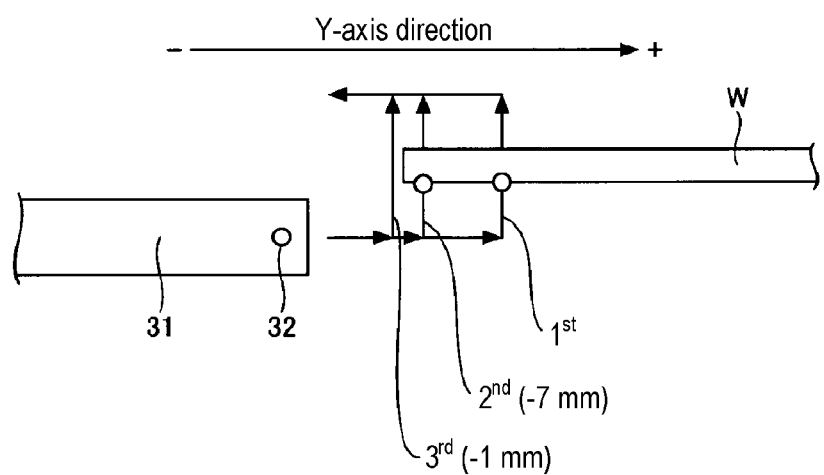
FIGS. 6A, 6B and 6C are diagrams showing an example of an operation of specifying a position of an edge of a wafer.
Figure 6C:
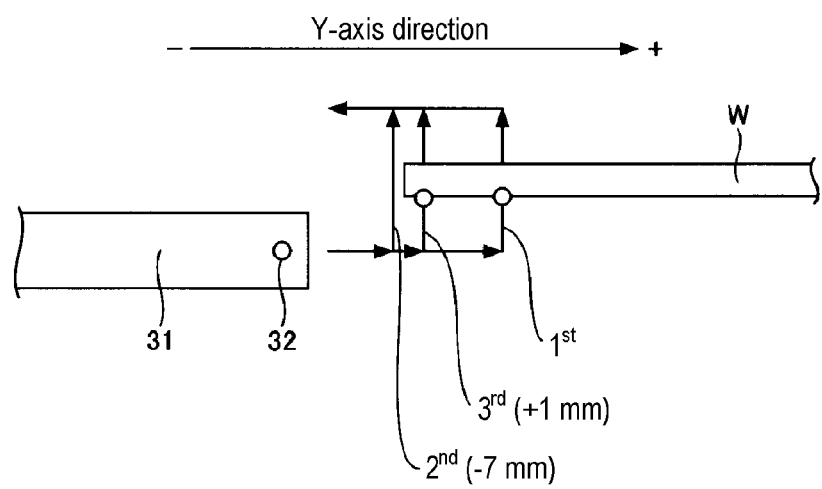

Now, the setting of the receiving position (pick Y position) of the pick 31 in the Y-axis direction shown in steps S106 to S113 will be further described with reference to FIGS. 6A to 6C. FIGS. 6A to 6C are diagrams showing an example of an operation of specifying the position of the edge of the wafer W. FIG. 6A is an example of a table showing the correction amount at each mapping position and the correction amount in the Y-axis direction in examples 1 to 4. FIG. 6B is a schematic diagram illustrating the operation in example 1. FIG. 6C is a schematic diagram illustrating the operation in example 3.

In example 1, if the wafer W is detected in the first mapping (S102) (if yes in S103), the second mapping (S106) is performed at a position of −7 mm (set value) away from the first mapping position in the Y-axis direction. If the wafer W is detected in the second mapping (S106) (if yes in S107), the third mapping (S108) is performed at a position of −1 mm (feed value) away from the second mapping position in the Y-axis direction. If the wafer W is not detected in the third mapping (if no in S109), it can be determined that the edge of the wafer W is located between the second mapping position and the third mapping position. In this case, it is specified that the edge of the wafer W is located at an intermediate position (a position of −7.5 mm away from the first mapping position in the Y-axis direction) between the second mapping position and the third mapping position. Then, the controller 7 sets the difference between the position (−7.5 mm) of the edge of the wafer W specified by the mapping operation and the design value (−7 mm) of the position of the edge of the wafer W as a correction value (−0.5 mm) in the Y-axis direction.

Similarly, in example 2, if the wafer W is detected in the second and third mappings and if the wafer W is not detected in the fourth mapping, it can be determined that the edge of the wafer W is located between the third mapping position and the fourth mapping position. In this case, it is specified that the edge of the wafer W is located at an intermediate position (a position of −8.5 mm away from the first mapping position in the Y-axis direction) between the third mapping position and the fourth mapping position. Then, the controller 7 sets the difference between the position (−8.5 mm) of the edge of the wafer W specified by the mapping operation and the design value (−7 mm) of the position of the edge of the wafer W as a correction value (−1.5 mm) in the Y-axis direction.

Further, in example 3, if the wafer W is detected in the first mapping (S102) (if yes in S103), the second mapping (S106) is performed at a position of −7 mm (set value) away from the first mapping position in the Y-axis direction. If the wafer W is not detected in the second mapping (S106) (if no in S107), the third mapping (S111) is performed at a position of +1 mm (feed value) away from the second mapping position in the Y-axis direction. If the wafer W is detected in the third mapping (if yes in S112), it can be determined that the edge of the wafer W is located between the second mapping position and the third mapping position. In this case, it is specified that the edge of the wafer W is located at an intermediate position (a position of −6.5 mm away from the first mapping position in the Y-axis direction) between the second mapping position and the third mapping position. Then, the controller 7 sets the difference between the position (−6.5 mm) of the edge of the wafer W specified by the mapping operation and the design value (−7 mm) of the position of the edge of the wafer W as a correction value (+0.5 mm) in the Y-axis direction.

Similarly, in example 4, if the wafer W is not detected in the second and third mappings and if the wafer W is detected in the fourth mapping, it can be determined that the edge of the wafer W is located between the third mapping position and the fourth mapping position. In this case, it is specified that the edge of the wafer W is located at an intermediate position (a position of −5.5 mm away from the first mapping position in the Y-axis direction) between the third mapping position and the fourth mapping position. Then, the controller 7 sets the difference between the position (−5.5 mm) of the edge of the wafer W specified by the mapping operation and the design value (−7 mm) of the position of the edge of the wafer W as a correction value (+1.5 mm) in the Y-axis direction.

In this regard, the position of the edge of the wafer W specified by the mapping operation is deviated from the design value of the position of the edge of the wafer W by the correction value in the Y-axis direction. In other words, the receiving position in the Y-axis direction for teaching is also deviated from the design value of the receiving position in the Y-axis direction by the correction value in the Y-axis direction. Therefore, the controller 7 sets the value obtained by correcting the design value of the receiving position in the Y-axis direction with the correction value in the Y-axis direction as a receiving position (pick Y position) in the Y-axis direction. The accuracy of the receiving position (pick Y position) in the Y-axis direction thus set depends on the magnitude of the feed value. In other words, the controller 7 provisionally corrects the design value of the receiving position in the Y-axis direction with the correction value in the Y-axis direction and sets the provisionally corrected design value as a receiving position (pick Y position) in the Y-axis direction.

If the wafer W is detected in step S109 (if yes in S109) even when step S108 is repeated a predetermined number of times (e.g., 9 times) or more, the controller 7 may determine that an error has occurred and may stop the teaching operation. Further, if the wafer W is not detected in step S112 (if no in S112) even when step S111 is repeated a predetermined number of times (e.g., 9 times) or more, the controller 7 may determine that an error has occurred and may stop the teaching operation. Further, the controller 7 may cause a display device (not shown) to display a warning that urges the operator to check the installation state of the wafer W, the state of the atmospheric transfer device 30 (the position of the pick 31 or the like), and so forth. This makes it possible to notify the operator of the occurrence of an error.

FIG. 7 is a flowchart illustrating an example of the teaching operation of the atmospheric transfer device 30. FIGS. 8A to 8D are plan views showing the state of the wafer W in the alignment device 6 at respective time points. After the receiving position (pick Z position) of the pick 31 in the Z-axis direction and the receiving position (pick Y position) of the pick 31 in the Y-axis direction are set according to the flow shown in FIG. 5, the process shown in FIG. 7 is executed.

In step S201, the controller 7 transfers the wafer W from the teaching target module to the alignment device 6. In the present embodiment, the controller 7 controls the pick 31 of the atmospheric transfer device 30 so that the center position 37 of the pick 31 is moved to the receiving position of the teaching target module to receive the wafer W by the pick 31 and is moved to the delivery position of the alignment device 6 to transfer the wafer W by the pick 31 and deliver the wafer W from the pick 31 to the stage 60 of the alignment device 6. In this case, the receiving position in the X-axis direction is the set value of the receiving position in the X-axis direction. In addition, the receiving position in the Y-axis direction is the receiving position (pick Y position) in the Y-axis direction set in step S110 or step S113.

Figure 8A:
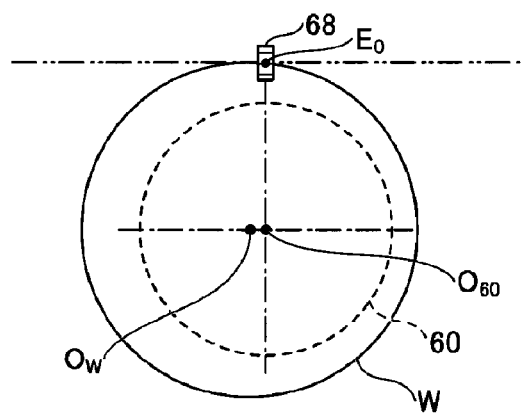
FIGS. 8A to 8D are plan views showing the state of the wafer on the alignment device at respective time points.

FIG. 8A shows a state in which the wafer W is placed on the stage 60 of the alignment device 6. In the example shown in FIG. 8A, the center position $O_{60}$ of the stage 60 and the center position $O_W$ of the wafer W are out of alignment and eccentric. Specifically, since the receiving position in the X-axis direction is a pre-teaching state (set value), the deviation of the center position $O_W$ of the wafer W from the center position $O_{60}$ of the stage 60 in the left-right direction is large. On the other hand, since the accuracy of the receiving position in the Y-axis direction depends on the magnitude of the feed value, the deviation of the center position $O_W$ of the wafer W from the center position $O_{60}$ of the stage 60 in the up-down direction is assumed to be small. The position of the edge of the wafer W detected by the line sensor 68 before the rotation of the stage 60 (0°) is defined as edge position $E_0$.

In step S202, the controller 7 rotates the stage 60 on which the wafer W is placed by a predetermined angle (e.g., 45°) in one rotational direction (e.g., clockwise) and allows the line sensor 68 to continuously detect and store a displacement amount L of the position of the edge of the wafer W from the start of rotation (0°) to the rotation by the predetermined angle (e.g., 45°). The predetermined angle by which the stage 60 is rotated is less than 360°, more preferably less than 90°.

Figure 8B:
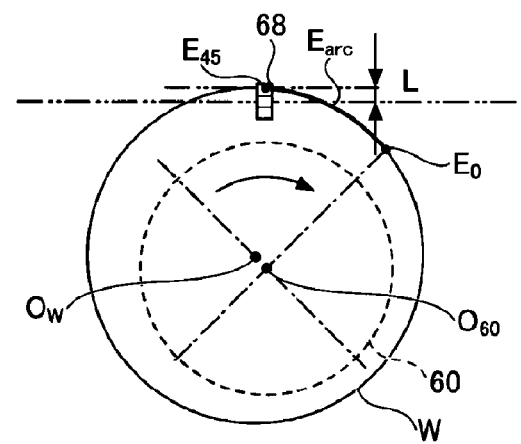

FIG. 8B shows a state in which the stage 60 on which the wafer W is placed is rotated clockwise by a predetermined angle (e.g., 45°). In FIG. 8B, the edge position of the wafer W detected by the line sensor 68 before the rotation of the stage 60 (0°) is defined as an edge position $E_0$, and the edge position of the wafer W detected by the line sensor 68 when the stage 60 is rotated by a predetermined angle (45°) is defined as an edge position $E_{45}$. The controller 7 detects the locus $E_{arc}$ of the edge position of the wafer W from the edge position $E_0$ to the edge position $E_{45}$ by allowing the line sensor 68 to continuously detect the displacement amount L of the position of the edge of the wafer W from the start of rotation (0°) to the rotation by a predetermined angle (e.g., 45°).

In step S203, the controller 7 estimates the eccentricity amount based on the displacement amount L (the locus $E_{arc}$ of the edge position) continuously detected until the rotation by the predetermined angle.

Figure 8C:
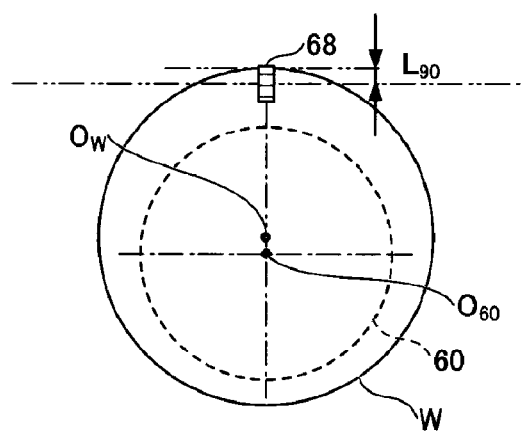

FIG. 8C shows a virtual state in which the stage 60 on which the wafer W is placed is rotated 90° in a clockwise direction. In the example shown in FIG. 8C, by rotating the stage 60 clockwise by 90°, the deviation in the left-right direction of the center position $O_W$ of the wafer W with respect to the center position $O_{60}$ of the stage 60 before rotation (see FIG. 8A) becomes the deviation in the up-down direction detected by the line sensor 68. The controller 7 estimates a displacement amount $L_{90}$ of the edge position at the time of rotating the stage 60 clockwise by 90°, based on the displacement amount L (the locus $E_{arc}$ of the edge position shown in FIG. 8B) continuously detected until the stage 60 is rotated to the predetermined angle. Then, the controller 7 estimates the estimated displacement amount $L_{90}$ of the edge position as an eccentricity amount.

Although the description has been made on the example in which the displacement amount L90 of the edge position when the stage 60 is rotated clockwise 90° is estimated as the eccentricity amount, the present disclosure is not limited thereto. For example, the controller 7 may estimate the center position $O_W$ of the wafer W based on the displacement amount L (the locus $E_{arc}$ of the edge position shown in FIG. 8B) continuously detected until the wafer W is rotated to the predetermined angle. Thereafter, the controller 7 may estimate the deviation of the center position $O_W$ of the wafer W from the center position $O_{60}$ of the stage 60 as an eccentricity amount.

In step S204, the controller 7 determines whether the eccentricity amount estimated in step S203 falls within a permissible value (threshold value) of the alignment device 6.

If the estimated eccentricity amount does not fall within the permissible value of the alignment device 6 (if no in S204), the process of the controller 7 proceeds to step S205. If it is determined that the estimated eccentricity amount does not fall within the permissible value of the alignment device 6 before the rotation of the stage 60 reaches a predetermined angle, the controller 7 may stop the rotation of the stage 60 and may allow the process of the controller 7 to proceed to step S205.

Figure 8D:
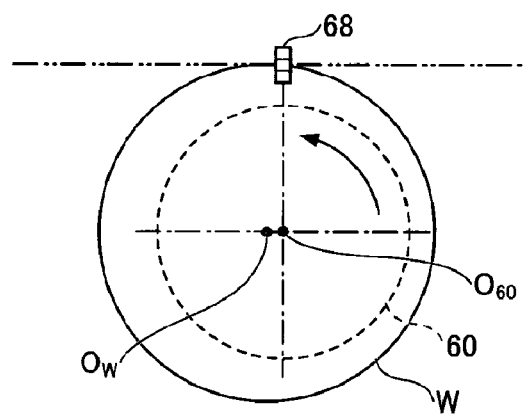

In step S205, the controller 7 rotates the stage 60 in a rotational direction (e.g., counterclockwise) opposite to the one rotational direction (e.g., clockwise) to return the stage 60 to the original angle at which the wafer W is placed on the stage 60. FIG. 8D shows a state in which the stage 60 is returned to the original angle. As a result, the state of the wafer W corresponds to the state available immediately after the wafer W was placed on the stage 60 (see FIG. 8A). Then, the controller 7 controls the pick 31 of the atmospheric transfer device 30 to transfer the wafer W from the alignment device 6 to the teaching target module. As a result, the wafer W is returned to the state available immediately before the start of step S201.

In step S206, the controller 7 sets a receiving position (pick X position) of the pick 31 in the X-axis direction (another horizontal direction) based on the eccentricity amount estimated in step S203. In other words, the controller 7 provisionally corrects the design value of the receiving position in the X-axis direction with the estimated eccentricity amount and sets the provisionally corrected design value as a receiving position (pick X position) in the X-axis direction.

Then, the process of the controller 7 returns to step S201 to execute steps S201 to S204 again. That is, in step S201, the controller 7 controls the pick 31 of the atmospheric transfer device 30 so that the center position 37 of the pick 31 is moved to the receiving position of the teaching target module to receive the wafer W by the pick 31 and is moved to the delivery position of the alignment device 6 to transfer the wafer W by the pick 31 and deliver the wafer W from the pick 31 to the stage 60 of the alignment device 6. In this case, the receiving position in the X-axis direction is the receiving position (pick X position) in the X-axis direction set in step S206. Further, the receiving position in the Y-axis direction is the receiving position (pick Y position) in the Y-axis direction set in step S110 or step S113. As a result, the deviation of the center position $O_W$ of the wafer W from the center position $O_{60}$ of the stage 60 in the left-right direction can be reduced as compared with the case of FIG. 8A. Thereafter, steps S202 to S204 are executed again.

When the estimated eccentricity amount falls within the permissible value of the alignment device 6 (e.g., the measurable range of the line sensor 68) (if yes in S204), the process of the controller 7 proceeds to step S207.

In step S207, the controller 7 operates the alignment device 6 to measure an eccentricity amount. In this case, the controller 7 continuously rotates the stage 60 to a predetermined angle. Further, the line sensor 68 continuously detects and stores the displacement amount L of the position of the edge of the wafer W. As a result, in steps S202 and S207, the displacement amount L of the edge position for the entire circumference of the wafer W is stored. The controller 7 measures the center position $O_W$ of the wafer W from the displacement amount L (the locus of the edge position of the entire circumference) of the position of the edge of the entire circumference of the wafer W and measures the eccentricity amount which is the deviation amount of the center position $O_W$ of the wafer W with respect to the center position $O_{60}$ of the stage 60. In this case, by measuring the entire circumference of the edge of the wafer W, the eccentricity amount can be measured with higher accuracy than the eccentricity amount estimated in step S203.

In step S208, the controller 7 returns the stage 60 to the original angle. Then, the controller 7 controls the pick 31 of the atmospheric transfer device 30 to transfer the wafer W from the alignment device 6 to the teaching target module. As a result, the wafer W is returned to the state available immediately before the start of step S201.

In step S209, the controller 7 sets a receiving position (pick X position) of the pick 31 in the X-axis direction and a receiving position (pick Y position) of the pick 31 in the Y-axis direction based on the eccentricity amount measured by the alignment device 6 in step S207. In other words, the controller 7 permanently correct the provisionally corrected receiving positions of the pick 31 in the X-axis direction and the Y-axis direction with the eccentricity amount measured by the alignment device 6 and sets the permanently corrected receiving positions as the receiving position (pick X position) of the pick 31 in the X-axis direction and the receiving position (pick Y position) of the pick 31 in the Y-axis direction.

As described above, according to the teaching method of the atmospheric transfer device 30 of the present embodiment, the receiving positions (teaching positions) in the horizontal direction (the X-axis direction and the Y-axis direction) can be provisionally corrected so that the eccentricity amount falls within the permissible value of the alignment device 6, and then the receiving positions can be corrected using the alignment device 6 (S207 to S209). Specifically, the provisional correction of the receiving positions is performed by provisionally correcting the receiving position (pick Y position) in the Y-axis direction (see steps S110 and S113) and provisionally correcting the receiving position (pick X position) in the X-axis direction (see step S206). As a result, even if the deviation between the set value of the receiving position and the receiving position after teaching exceeds the permissible value of the alignment device 6, the receiving position can be provisionally corrected to perform the teaching operation. In addition, the teaching of the atmospheric transfer device 30 can be automated.

Further, when the receiving position (pick Y position) in the Y-axis direction is provisionally corrected (see steps S110 and S113), it is possible to use the mapping sensor 32 provided on the pick 31. This can eliminate the need to add a new device.

Further, after provisionally correcting the receiving position in the Y-axis direction, the wafer W is transferred to the alignment device 6 and the eccentricity amount is estimated by the alignment device 6 (see step S202). As a result, the eccentricity amount due to the deviation of the receiving position in the Y-axis direction can be reduced in advance.

Further, since the eccentricity amount is estimated by rotating the stage 60 by a predetermined angle (e.g., 45°) (see step S202), even when the displacement amount $L_{90}$ of the edge position when the stage 60 is rotated by 90° exceeds the permissible value (e.g., the measurable range of the line sensor 68), it is possible to estimate the eccentricity amount as long as the displacement amount L of the edge position when the stage 60 is rotated by the predetermined angle falls within the permissible value (e.g., the measurable range of the line sensor 68). As a result, the teaching operation can be performed even when the deviation between the initial value of the receiving position and the corrected receiving position exceeds the permissible value of the alignment device 6.

As for the feed value used in steps S108 and S111, the smaller the value, the better the accuracy of the provisional correction of the receiving position in the Y-axis direction. However, the number of mapping operations may increase and the teaching work time may increase. On the other hand, the receiving positions in the X-axis direction and the Y-axis direction are permanently corrected based on the eccentricity amount measured by the alignment device 6 (see steps S207 to S209). Therefore, the feed value may be corrected so as to fall within the permissible value of the alignment device 6. As a result, the number of repetitions of steps S109 and S112 can be reduced, and the teaching work time can be shortened.

Further, in steps S202 and S203, the stage 60 can be rotated by a predetermined angle (e.g., 45°) to estimate the eccentricity amount. Therefore, the eccentricity amount can be estimated in a shorter processing time as compared with the case where the stage 60 is rotated once.

It has been described that in step S207, the stage 60 is rotated once to measure the eccentricity amount. However, the present disclosure is not limited thereto. For example, a configuration is possible in which the displacement amount L of the position of the edge of the wafer W is continuously detected while the stage 60 is rotated by 90°, the center position $O_W$ of the wafer W is estimated based on the continuously detected displacement amount L (the locus of the position of the edge), and the eccentricity amount, which is the deviation amount of the center position $O_W$ of the wafer W from the center position $O_{60}$ of the stage 60, is measured. As a result, the eccentricity amount can be measured in a shorter processing time as compared with the case where the stage 60 is rotated once.

As the teaching target module, the predetermined slot of the FOUP 5 installed in the predetermined load port 4 has been described by way of example. However, the present disclosure is not limited thereto. When the load lock chamber 2 is used as the teaching target module, teaching can be performed in the same manner.

Further, the teaching positions (receiving positions) of the pick 31 have been described as defined by the Cartesian coordinate system (X, Y and Z). However, the present disclosure is not limited thereto. The teaching operation of the present disclosure may also be applied to a cylindrical coordinate system (R, θ and Z).

According to the present disclosure in some embodiments, it is possible to provide a teaching method for a transfer device, and a transfer system.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A teaching method for a transfer device that includes a pick configured to hold a substrate and a mapping sensor, comprising:
   detecting a position of an edge of the substrate arranged in a teaching target module by the mapping sensor and setting a teaching position in one horizontal direction;
   transferring the substrate from the teaching target module to a stage of an alignment device by the pick based on the set teaching position;
   rotating the stage by a predetermined angle and detecting a locus of the position of the edge of the substrate; and
   estimating an eccentricity amount between the stage and the substrate based on the detected locus of the position of the edge of the substrate.

2. The teaching method of claim 1, further comprising:
   determining whether the estimated eccentricity amount exceeds a threshold value,
   wherein if the estimated eccentricity amount exceeds the threshold value, the teaching method further comprises:
   returning the stage to an original angle and transferring the substrate from the alignment device to the teaching target module by the pick;
   setting a teaching position in another horizontal direction based on the estimated eccentricity amount;
   transferring the substrate from the teaching target module to the stage of the alignment device by the pick based on the set teaching position;
   rotating the stage by the predetermined angle and detecting a locus of the position of the edge of the substrate; and
   estimating an eccentricity amount between the stage and the substrate based on the detected locus of the position of the edge of the substrate.

3. The teaching method of claim 2, wherein the predetermined angle is less than 90°.

4. The teaching method of claim 3, wherein the estimated eccentricity amount is a displacement amount of the position of the edge of the substrate when the stage is rotated by 90°.

5. The teaching method of claim 4, further comprising:
   determining whether the estimated eccentricity amount exceeds a threshold value,
   wherein if the estimated eccentricity amount does not exceed the threshold value, the teaching method further comprises:
   measuring an eccentricity amount between the stage and the substrate by the alignment device;
   returning the stage to an original angle and transferring the substrate from the alignment device to the teaching target module by the pick; and
   setting the teaching position in the one horizontal direction based on the measured eccentricity amount.

6. The teaching method of claim 1, wherein the predetermined angle is less than 90°.

7. The teaching method of claim 1, wherein the estimated eccentricity amount is a displacement amount of the position of the edge of the substrate when the stage is rotated by 90°.

8. The teaching method of claim 1, further comprising:
   determining whether the estimated eccentricity amount exceeds a threshold value,
   wherein if the estimated eccentricity amount does not exceed the threshold value, the teaching method further comprises:
   measuring an eccentricity amount between the stage and the substrate by the alignment device;
   returning the stage to an original angle and transferring the substrate from the alignment device to the teaching target module by the pick; and
   setting the teaching position in the one horizontal direction based on the measured eccentricity amount.

9. A transfer system, comprising:
   a transfer device including a pick configured to hold a substrate and a mapping sensor;
   an alignment device; and
   a controller,
   wherein the controller is configured to:
   control the transfer device to detect a position of an edge of the substrate arranged in a teaching target module by the mapping sensor;
   set a teaching position in one horizontal direction based on the detected position of the edge of the substrate;
   control the transfer device to transfer the substrate from the teaching target module to a stage of the alignment device by the pick based on the set teaching position;
   control the alignment device to rotate the stage by a predetermined angle and detect a locus of the position of the edge of the substrate; and
   estimate an eccentricity amount between the stage and the substrate based on the detected locus of the position of the edge of the substrate.

* * * * *